United States Patent [19]

Kawagoe

[11] Patent Number: 5,680,354
[45] Date of Patent: Oct. 21, 1997

[54] SEMICONDUCTOR MEMORY DEVICE CAPABLE OF READING INFORMATION STORED IN A NON-VOLATILE MANNER IN A PARTICULAR OPERATION MODE

[75] Inventor: Tomoya Kawagoe, Hyogo, Japan

[73] Assignee: Mitsubishi Denki Kabushiki Kaisha, Tokyo, Japan

[21] Appl. No.: 623,552

[22] Filed: Mar. 28, 1996

[30] Foreign Application Priority Data

Jul. 14, 1995 [JP] Japan .................. 7-179028

[51] Int. Cl.$^6$ ............................ G11C 7/00
[52] U.S. Cl. ..................... 365/200; 365/225.7
[58] Field of Search .................. 365/200, 225.7, 365/230.03; 371/10.1, 10.2, 10.3

[56] References Cited

U.S. PATENT DOCUMENTS

| | | | |
|---|---|---|---|
| 4,480,199 | 10/1984 | Varshney et al. | 365/200 |
| 4,984,205 | 1/1991 | Suugibayashi | 365/200 |
| 5,128,944 | 7/1992 | Flaherty | 365/200 |
| 5,206,831 | 4/1993 | Wakamatsu | 365/200 |

FOREIGN PATENT DOCUMENTS

| | | |
|---|---|---|
| 59-114864 | 7/1984 | Japan . |
| 59-162698 | 9/1984 | Japan . |
| 1-165100 | 6/1989 | Japan . |
| 3-283197 | 12/1991 | Japan . |
| 5-78187 | 10/1993 | Japan . |

Primary Examiner—David C. Nelms
Assistant Examiner—Son Mai
Attorney, Agent, or Firm—Lowe, Price, LeBlanc & Becker

[57] ABSTRACT

A defective bit address registering circuit stores an address corresponding to a detective memory cell replaced with a redundant memory cell in a non-volatile manner, and activates a redundant memory cell selection signal S2 if an internal address signal A0, ..., An, /A0, ..., /An matches a defective bit address. An I/O data inverting circuit receives input data and output data and outputs the received data without inversion if the redundant memory cell selection signal S2 is inactive. On the other hand, the I/O data inverting circuit outputs inverted data of the received data if the redundant memory cell selection signal S2 is active. Accordingly, if a read operation is performed when data in all the memory cells are at an "L" level such as right after the power supply is turned on, a signal at an "H" level is output only when a memory cell corresponding to a defective bit address is accessed.

10 Claims, 8 Drawing Sheets

SEMICONDUCTOR MEMORY DEVICE CAPABLE OF READING INFORMATION STORED IN A NON-VOLATILE MANNER IN A PARTICULAR OPERATION MODE

BACKGROUND OF THE INVENTION

1. Field of the Invention

The present invention relates to a semiconductor memory device, and more particularly, to a semiconductor memory device capable of repairing defects generated during manufacture thereof, and to a semiconductor memory device capable of reading/writing prescribed information in a non-volatile manner on a prescribed operation condition.

2. Description of the Background Art

With increase in capacity of a memory cell array in a semiconductor memory device, in particular, a dynamic random access memory (hereinafter referred to as a DRAM), chip area thereof also increases, so that manufacture yield is reduced due to a defective bit, disconnection of a word line or a column select line, or defects such as short circuit.

Accordingly, in general, a spare memory cell (hereinafter referred to as a redundant bit) is formed in advance in a chip in addition to regular memory cells, and a redundant circuit for repairing a defective bit, a defective word line and the like by substituting a spare memory cell column or a spare memory cell row for a column or a row having a defective bit, a defective word line and the like in a memory cell array is provided, thereby improving the yield.

In defect analysis or the like of memory cells, it would be convenient to know if a spare memory cell has been used or not and to know an address of a defective bit even in the stage of the finished product without carrying out an inefficient way such as disassembly of the finished product.

In response to such a requirement, a technique has been proposed in which a non-volatile storage element for indicating whether a redundant memory cell has been substituted for a defective memory cell or not is provided in a memory and whether a redundant bit is used in a memory cell or not can be known after assembly of a semiconductor memory device in a molded package or the like.

A first conventional example is the above-described technique disclosed in the U.S. Pat. No. 4,480,199, for example.

Figure 9:
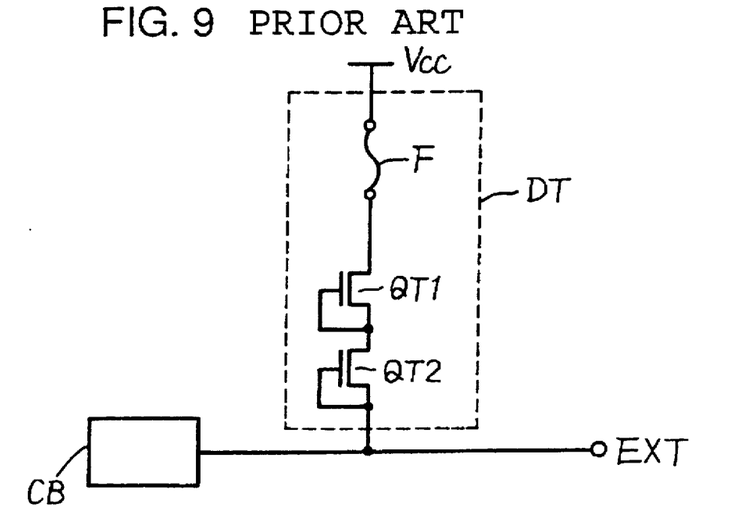
FIG. 9 is a circuit diagram showing an arrangement of a first conventional example.

FIG. 9 shows a circuit DT as described above for detecting whether a redundant bit is used or not.

Circuit DT is constituted such that a fuse F as a fixed storage element and diode-connected MOS transistors $Q_{T1}$ and $Q_{T2}$ are connected in series between a power supply potential $V_{CC}$ and an external terminal EXT connected to an internal circuit CB.

Fuse F is blown if a redundant memory cell is substituted functionally for a defective memory cell in a regular memory cell array, and is not blown otherwise. The fuse is blown at the time of an on-wafer test.

In a normal operation, voltage of external terminal EXT is in the range from potential $V_{CC}$ to the ground potential, transistors $Q_{T1}$ and $Q_{T2}$ are off, and fuse F is isolated electrically from external terminal EXT. Therefore, fuse F has no influence on the normal operation.

Whether a redundant memory cell is used as a memory cell or not can be determined by turning on transistors $Q_{T1}$ and $Q_{T2}$ by application of voltage which is higher than power supply voltage $V_{CC}$ by the sum of threshold voltages of transistors $Q_{T1}$ and $Q_{T2}$ to external terminal EXT, and determining whether fuse F is blown or not by presence/absence of current flowing from terminal EXT to terminal $V_{CC}$.

However, since this method requires application of voltage equal to or higher than a normal power supply voltage at the time of the test, operation is complicated, and a substitute address of a redundant bit cannot be known.

In addition, function and the number of external terminals are determined by the standard in the finished product of a semiconductor memory device, provision of a terminal for inspection is difficult.

Consequently, a second conventional example which has solved problems as described above is disclosed in Japanese Patent Laying-Open No. 3-283197.

Figure 10:
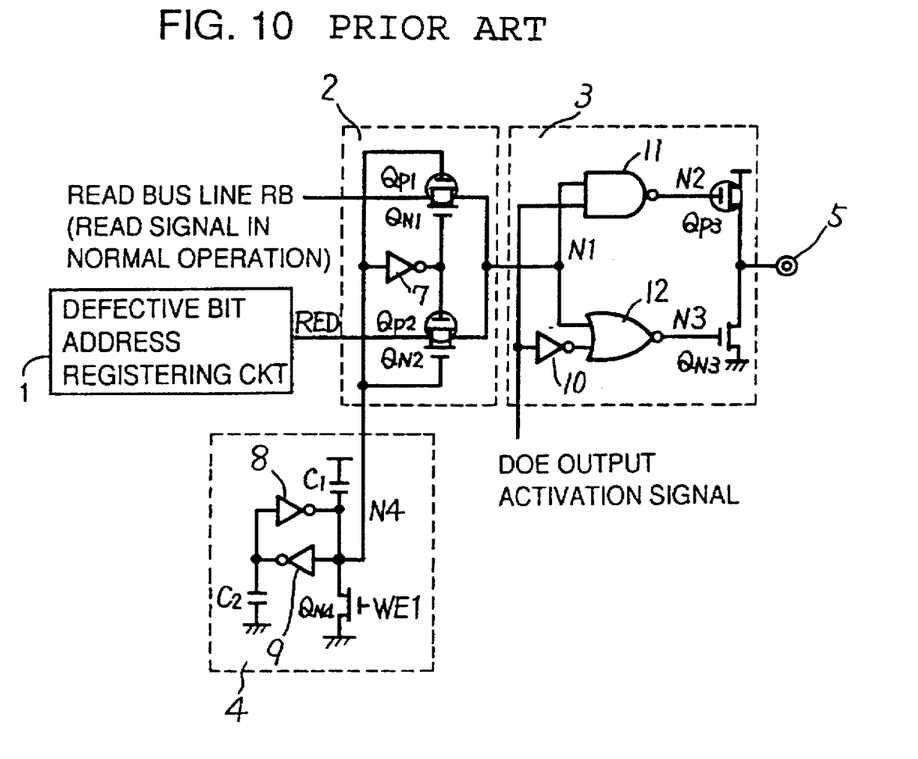
FIG. 10 is a schematic block diagram showing an arrangement of a second conventional example.

FIG. 10 is a circuit diagram showing a main part of an arrangement of a semiconductor memory device of the second conventional example.

The semiconductor memory device of the second conventional example includes a defective bit address registering circuit 1 for storing a defective bit address in a non-volatile manner; a switching circuit 2 for receiving a read signal transmitted from a memory cell through a read bus line RB and an output signal of the defective bit address registering circuit, and selecting one of the received signals as an output signal thereof in response to a switching signal N4; an output circuit 3 for receiving an output of switching circuit 2, and outputting a signal according to a read signal to an external output terminal 5 in response to an output activation signal DOE; and a switching signal generating circuit 4 responsive to a write control signal WE1 for switching a level of switching signal N4.

Defective bit address registering circuit 1 stores a defective bit address in a non-volatile manner, and outputs an output signal RED at an "H" level if an external address input signal matches an address corresponding to a repaired defective bit. On the other hand, defective bit address registering circuit 1 outputs an output signal RED at an "L" level if an external address signal does not match an address corresponding to a repaired defective bit.

Switching signal generating circuit 4 is controlled by an output WE1 of a write control circuit (not shown), and transistor size of inverters 8 and 9 constituting a flip-flop is adjusted and capacitances $C_1$ and $C_2$ are inserted in switching signal generating circuit 4 so that an output N4 attains an "H" level after turning on a power supply whenever output WE1 is at an "L" level. On the other hand, if signal WE1 attains an "H" level, an N type MOS transistor $Q_{N4}$ is turned on to invert an output of the flip-flop circuit, so that output signal N4 is at an "L" level. Switching circuit 2 is constituted by an inverter 7 for inverting an output signal N4 of the switching signal generating circuit; a P type MOS transistor $Q_{P1}$ and an N type MOS transistor $Q_{N2}$ whose gate potentials are controlled by an output signal N4; and a P type MOS transistor $Q_{P2}$ and an N type MOS transistor $Q_{N1}$ whose gate potentials are controlled by an output of inverter 7. With such an arrangement, switching circuit 2 outputs an output signal RED of defective bit address registering circuit 1 when an output signal N4 is at an "H" level, and outputs a read signal from a memory cell in a normal operation when an output signal N4 is at an "L" level.

Output circuit 3 is constituted by a P type MOS transistor $Q_{P3}$ having its source connected to a power supply and its drain connected to external output terminal 5; an N type MOS transistor $Q_{N3}$ having its drain connected to external output terminal 5 and its source grounded; an inverter 10 for inverting an output activation signal DOE; an NAND circuit 11 having an output connected to a node N2 which is connected to the gate of P type MOS transistor $Q_{P3}$, for receiving as inputs an output activation signal DOE and a signal of a node N1 which is an output of switching circuit 2; and an NOR circuit 12 having an output connected to a node N3 which is connected to the gate of N type MOS transistor $Q_{N3}$, for receiving as inputs an output of inverter 10 and a signal of node N1.

An operation of the circuit shown in FIG. 10 will now be described briefly.

If the power supply $V_{CC}$ is turned on with a write control terminal /WE (not shown) at an "H" level, an output signal WE1 of the write control circuit is kept at an "L" level, and an output signal N4 of switching signal generating circuit 4 attains an "H" level, so that switching circuit 2 transmits an output signal RED of defective bit address registering circuit 1 to output circuit 3.

If an external address signal is successively changed in this condition, a signal at an "H" level is output to external output terminal 5 when an address of a repaired defective bit matches the external input address signal.

On the other hand, when an address of a defective bit does not match the external address signal, a signal at an "L" level is output to external output terminal 5.

Thus, an address of a repaired defective bit can be detected in a semiconductor memory device in the stage of the finished product.

Then, when write control external terminal /WE falls to an "L" level and the first write operation is initiated, a signal WE1 to be input to switching signal generating circuit 4 attains an "H" level. Accordingly, since an output signal N4 of switching signal generating circuit 4 is at an "L" level, a read signal of a normal operation is transmitted to output circuit 3.

Since an output signal N4 of switching signal generating circuit 4 is kept at an "L" level thereafter, a normal read operation can be performed.

Since the conventional semiconductor memory devices capable of determining whether a redundant memory is used or not have the following arrangements, there have been problems as will be described below.

More specifically, in the first conventional example, first, application of voltage equal to or higher than the power supply voltage which is normally used in a test mode is required, and second, an address of a defective bit cannot be known.

In DRAMs and the like, the number of external terminals is limited to a fixed number by the product standard. On the other hand, with increase in memory capacity, the number of external terminals to be used for inputting an address signal and for inputting/outputting data increases, and there is actually no free external terminal. Therefore, an external terminal used for these signals must be used for determining whether a redundant bit is used or not. Accordingly, special voltage equal to or higher than the power supply voltage is required at the time of the determination as described above, so that an internal circuit element connected to this external terminal might be broken or abnormal current might be produced due to this special voltage, resulting in reduction in reliability of a memory.

In addition, in the second conventional example, although these two problems described above have been solved, the power supply must be turned on with a write control terminal /WE kept at an "H" level in order to find an address of a defective bit.

Turning the power supply on with the write control terminal kept at an "H" level might cause malfunction or breakdown of an internal circuit element.

In addition to the above described problems, only an address of a defective memory cell replaced with a redundant bit can be known in the stage of the finished product having the arrangement of the conventional semiconductor memory device. However, for example, there is variation in access times of semiconductor memory devices due to variation in process during manufacture of semiconductor memory devices, and the products of semiconductor memory devices are sometimes ranked according to the access times. Accordingly, it would be convenient to prestore prescribed information on each semiconductor memory device in each semiconductor memory device during manufacturing process so that the information can be read in the stage of the finished product.

SUMMARY OF THE INVENTION

It is an object of the present invention to provide a semiconductor memory device capable of externally and electrically determining an address of a defective bit.

It is another object of the present invention to provide a semiconductor memory device capable of externally and electrically ascertaining, in the stage of the finished product, prescribed information on each semiconductor memory device which is pre-stored therein during manufacturing process.

In summary, a semiconductor memory device in accordance with one aspect of the present invention includes a memory cell array, a memory cell selecting circuit, a registered address detecting circuit, an input buffer circuit, and an output buffer circuit.

The memory cell array has a plurality of memory cells arranged in rows and columns. The memory cell selecting circuit is responsive to an external address signal and reads/writes stored data from and to a corresponding memory cell. The address detecting circuit stores a prescribed registered address in a non-volatile manner, and activates a registered address detection signal if an external address signal corresponds to the registered address. The input buffer circuit receives external input data, and outputs the data to the memory cell selecting circuit. The input buffer circuit includes an input data inverting circuit for receiving input data, and outputting inverted data of the received data if a registered address detection signal is active and outputting the received data without inversion if inactive. The output buffer circuit receives stored data read by the memory cell selecting circuit, and outputs the data externally. The output buffer circuit includes an output data inverting circuit for receiving stored data, and outputting inverted data of the received data if a registered address detection signal is active, and outputting the received data without inversion if inactive. In a read operation after a prescribed operation in which stored data in all the memory cells are set to a fixed value, stored data in a memory cell corresponding to a registered address is inverted to be read.

In accordance with another aspect of the present invention, a semiconductor memory device having a redundant bit for repairing a defective memory cell includes a memory cell array, a memory cell selecting circuit, a defective bit address registering circuit, a redundant memory cell selecting circuit, an input buffer circuit, and an output buffer circuit.

The memory cell array has a plurality of memory cells arranged in rows and columns and including a redundant memory cell corresponding to the redundant bit. The memory cell selecting circuit is responsive to an external address signal and reads/write stored data from and to a corresponding memory cell. The memory cell selecting circuit includes a non-volatile storage circuit for deactivating an operation for an external address signal corresponding to a defective memory cell. The defective bit address registering circuit stores a defective bit address corresponding to a defective memory cell in a non-volatile manner, and activates a redundant memory cell selection signal if an external address signal corresponds to the defective bit address. The redundant memory cell selecting circuit is responsive to a redundant memory cell selection signal and reads/writes stored data from and to a corresponding redundant memory cell. The input buffer circuit receives external input data, and outputs the data to the memory cell selecting circuit and the redundant memory cell selecting circuit. The input buffer circuit includes an input data inverting circuit for receiving input data, and outputting inverted data of the received data if a redundant memory cell selection signal is active and outputting the received data without inversion if inactive. The output buffer circuit receives stored data read by the memory cell selecting circuit and the redundant memory cell selecting circuit, and outputs the data externally. The output buffer circuit includes an output data inverting circuit for receiving stored data, and outputting inverted data of the received data if a redundant memory cell selection signal is active and outputting the received data without inversion if inactive. In a read operation after a prescribed operation in which stored data in all the memory cells are set to a fixed value, stored data in a memory cell corresponding to a defective bit address is inverted to be read.

Consequently, a primary advantage of the present invention is that prescribed information is stored in each semiconductor memory device according to a registered address pre-stored in a registered address detecting circuit during manufacturing process, so that the information can be checked electrically in the stage of the finished product.

Another advantage of the present invention is that a defective bit address replaced with a redundant bit, which is pre-stored in a defective bit address registering circuit, can be checked electrically even in the stage of the finished product.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
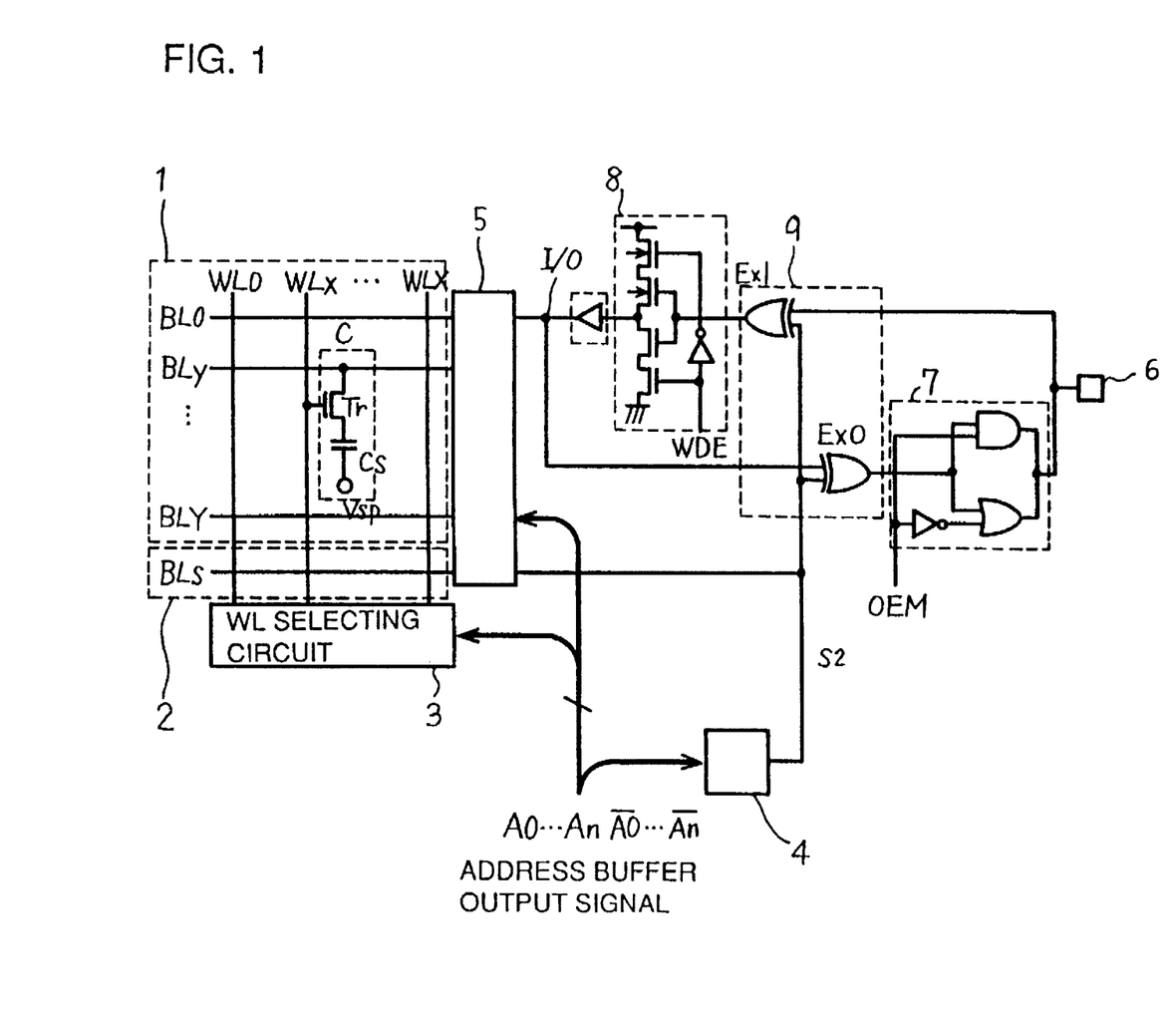
FIG. 1 is a schematic block diagram showing an arrangement of a semiconductor memory device in accordance with a first embodiment of the present invention.

FIG. 1 is a schematic block diagram showing an arrangement of a semiconductor memory device in accordance with a first embodiment of the present invention.

Referring to FIG. 1, a regular memory cell array 1 includes X+1 word lines $WL0, \ldots, WLx, \ldots, WL_x$, and Y+1 bit lines $BL0, \ldots, BL_y, \ldots, BLy$ which cross each word line at right angles. A spare bit line $BL_s$ cross each word line of regular memory cell array 2 at right angles.

A memory cell C is connected to each intersection of the word lines $WL_x$, and the bit lines $BL_y$ and the spare bit line $BL_s$.

Each memory cell C is constituted by a memory cell transistor Tr having its gate connected to a single word line and its source connected to a single bit line, and a capacitor $C_s$ having its one end connected to the drain of memory cell transistor Tr and the other end connected to a fixed potential power supply Vsp (not shown). A word line selecting circuit 3 causes an arbitrary one word line $WL_x$ out of word lines $WL0, \ldots, WL_x, \ldots, WLx$ to be at an "H" level according to 2(n+1) address buffer output signals $A0, \ldots, An, /A0, \ldots, /An$ from an address buffer (not shown). A defective bit address registering circuit 4 registers an address of a bit line to which a defective memory cell is connected, and outputs an output signal S2 at an "H" level if address buffer output signals $A0, \ldots, An, /A0, \ldots, /An$ match a registered address. A bit line selecting circuit 5 connects an arbitrary one bit line $BL_y$ out of bit lines $BL0, \ldots, BL_y, \ldots, BLy$ to an I/O line I/O according to address buffer signals $A0, \ldots, An, /A0, \ldots, /An$, if output signal S2 of the defective bit address registering circuit is at an "L" level. On the other hand, bit line selecting circuit 5 connects a spare bit line $BL_s$ to I/O line I/O if output signal S2 of the defective bit address registering circuit is at an "H" level.

A potential of an external I/O terminal 6 is caused to be at an "H" level or an "L" level according to the level of external input data in a write operation, and is caused to be at an "H" level or an "L" level according to the level of output data in a read operation. An output circuit 7 outputs output data to external output terminal 6 when an output signal control signal OEM is at an "H" level. An input signal control circuit 8 outputs input data to I/O line I/O when an input control signal WDE is at an "H" level.

An I/O data inverting circuit 9 inverts an input signal from external input terminal 6 to output the inverted signal to input signal control circuit 8 or inverts a signal of I/O line I/O to output the inverted signal to output circuit 7, if output signal S2 of defective bit address registering circuit 4 is at an "H" level. On the other hand, I/O data inverting circuit 9 outputs an input signal from external input terminal 6 to input signal control circuit 8 without inversion or outputs a signal of I/O line I/O to output circuit 7 without inversion.

if output signal S2 of defective bit address registering circuit 4 is at an "L" level.

Figure 2:
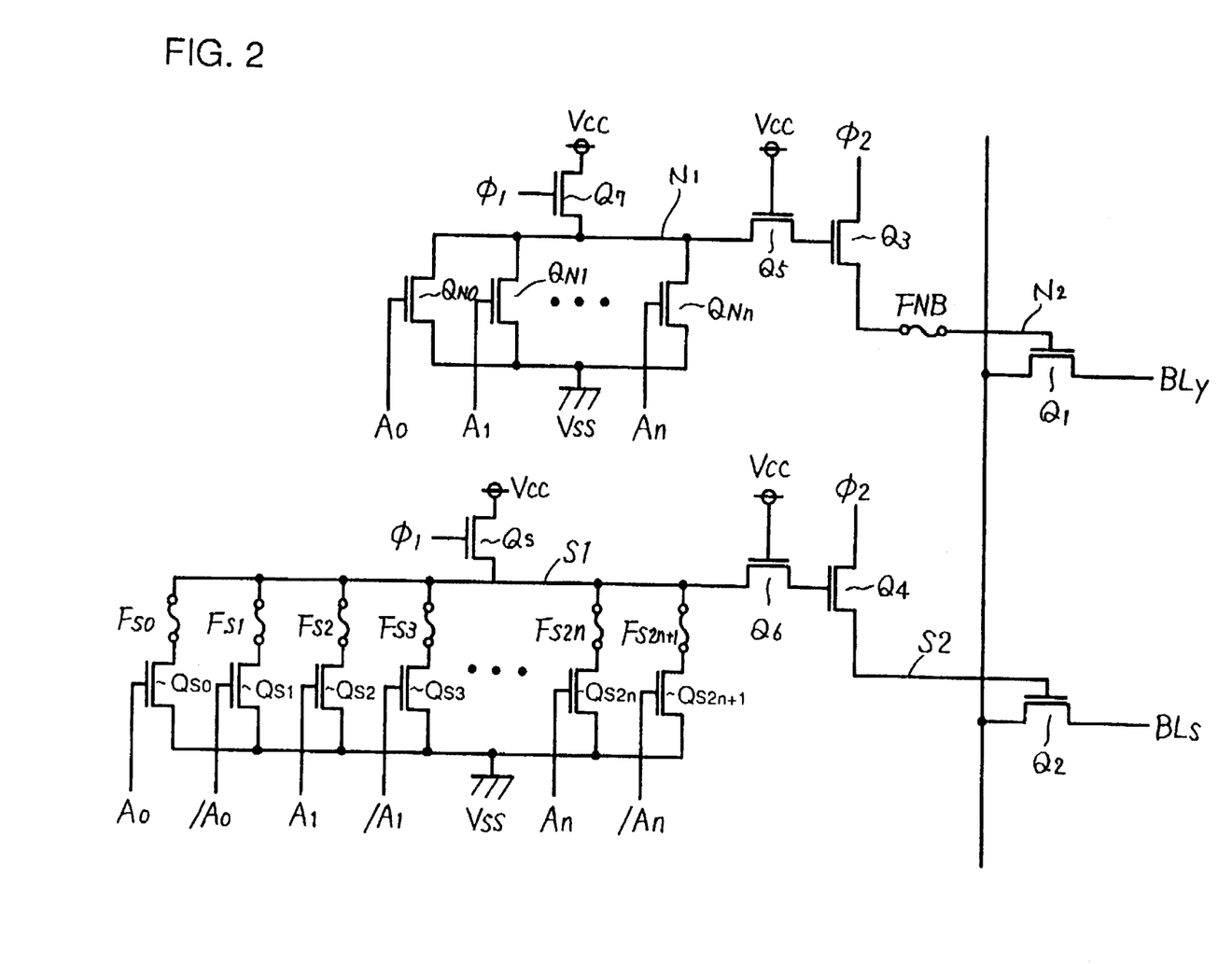
FIG. 2 is a circuit diagram showing an arrangement of a defective bit address registering circuit in accordance with the first embodiment of the present invention.

Referring to FIG. 2, a main part of a circuit structure of defective bit address registering circuit 4 and bit line selecting circuit 5 will now be described. It is noted that all the MOS field effect transistors (hereinafter referred to as FETs) in FIG. 2 are assumed to be N channel enhancement type transistors.

It is herein assumed that a memory cell connected to a bit line $BL_y$ is defective in regular memory cell array 1 of a DRAM, and a spare bit line $BL_s$ is connected to a spare memory cell which is not shown.

Bit line $BL_y$ is connected to the source of an FET Q1, and spare bit line $BL_s$ is connected to the source of an FET Q2. FETs Q1 and Q2 have their drains connected to a switching circuit (not shown) for connecting/disconnecting a corresponding bit line and an I/O line I/O to and from each other. FET Q1 has its gate connected to a node N2, which in turn is connected to one electrode of a program element such as a fuse element FNB, and the other electrode of fuse element FNB is connected to the source of an FET Q3. Output signal S2 of defective bit address registering circuit 4 is input to the gate of FET Q2, and to the source of an FET Q4. FET Q3 has its gate connected to the drain of an FET Q5, and FETs Q5 and Q6 have their gates connected to the power supply $V_{CC}$.

FETs Q3 and Q4 have their drains connected to a signal $\phi2$. An FET Q6 has its source connected to a node S1, which in turn is connected to the source of an FET $Q_s$ and to fuse elements $F_{s0}$–$F_{s2n}$ at one electrode. Fuse elements $F_{s0}$–$F_{s2n+1}$ are respectively connected to the drains of FETs $Q_{s0}$–$Q_{s2n+1}$ at the other electrode, and output signals (hereinafter referred to as internal address signals) A0, /A0, ..., An, /An from an address buffer which is not shown are respectively input to the gates of FETs $Q_{s0}$–$Q_{s2n+1}$, and the sources of FETs $Q_{s0}$–$Q_{s2n+1}$ are connected in common to the ground potential $V_{SS}$.

FETs $Q_{N0}$–$Q_{Nn}$ have their gates respectively connected to corresponding internal address signals. An example in which those gates are respectively connected to internal address signals A0, A1, ..., An is shown in FIG. 2, and in this case, a corresponding bit line is selected when all the internal address signals A0–An are at an "L" level, as will be described below.

FETs $Q_{N0}$–$Q_{Nn}$ have their sources connected in common to the ground potential $V_{SS}$. A signal $\phi1$ is input to the gates of an FET Q7 and an FET Qs, and the drains thereof are connected to the power supply voltage $V_{CC}$.

Figure 3:
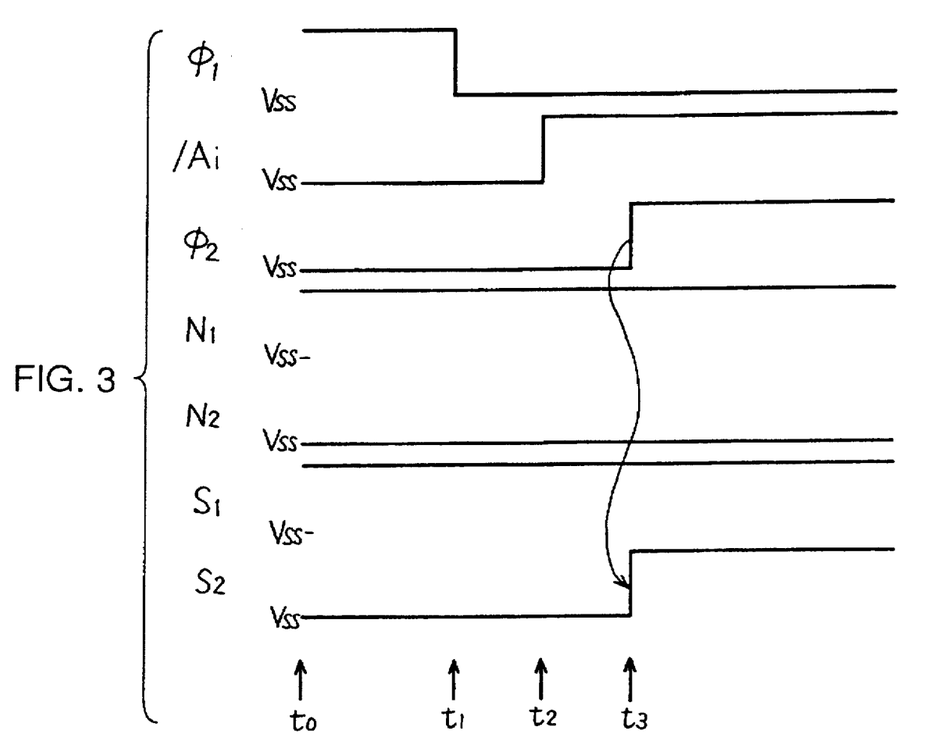
FIG. 3 is a first timing chart illustrating an operation of the first embodiment.
Figure 4:
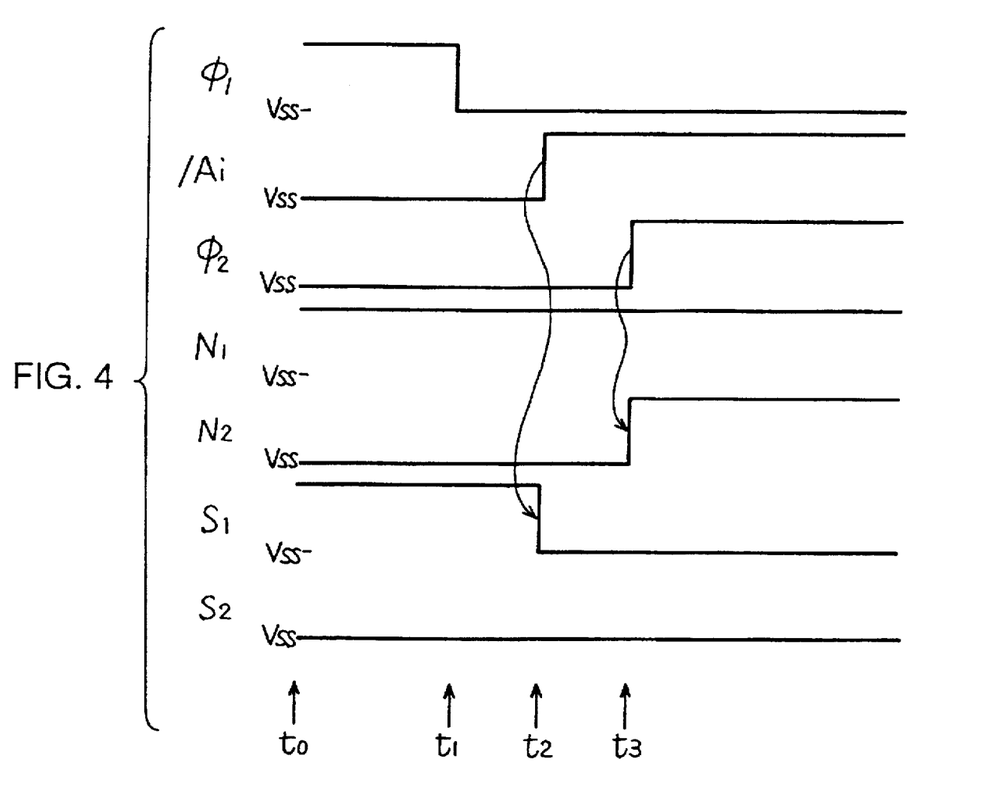
FIG. 4 is a second timing chart illustrating an operation of the first embodiment.

Referring to the timing charts shown in FIGS. 3 and 4, an operation of the first embodiment shown in FIG. 1 will now be described. FIG. 3 is a timing chart illustrating an operation before substitution of a spare memory cell for a defective memory cell, and FIG. 4 is a timing chart illustrating an operation after the substitution.

Referring to FIGS. 2 and 3, if a spare memory cell has not been substituted, signal $\phi1$ is at an "H" level and node N1 is precharged to an "H" level at times t0 and t1.

If address signals, for example, /A0, /A1, ..., /An attain an "H" level at time t2, address signals A0, A1, ..., An are kept at an "L" level, and node N1 is kept at an "H" level.

Accordingly, FET Q5 is turned off, and then, if a signal $\phi2$ attains an "H" level at time t3, a potential of signal $\phi2$ is directly transmitted to node N2 due to the self-bootstrap effect, so that FET Q1 is turned on, and bit line $BL_y$ is selected to be connected to I/O line I/O.

On the other hand, if address signals /A0, /A1, ..., /An attain an "H" level at time t2, FETs $Q_{s1}$, $Q_{s3}$, ..., $Q_{s2n+1}$ are turned on, so that output node S2 is discharged and spare bit line $BL_s$ will not be selected.

At this time, since output node S2 is connected to both one input of an exclusive OR circuit (hereinafter referred to as EXOR circuit) ExO and one input of an EXOR circuit ExI in I/O data inverting circuit 9, a signal at an "L" level would have been input thereto. It is noted that a signal corresponding to a potential level of output node S2 is also indicated by reference character S2 in the following.

Therefore, in a write op&ration, input data from external I/O terminal 6 is sent to input signal control circuit 8 without inversion. Input signal control circuit 8 outputs data from I/O data inverting circuit 9 to I/O line I/O when an input signal control signal WDE is at an "H" level.

On the other hand, in a read operation, data read from a memory cell and output to I/O line I/O is sent to output circuit 7 without inversion. Output circuit 7 outputs data sent from I/O data inverting circuit 9 to external I/O terminal 6 when an output data control signal OEM attains an "H" level.

If there is a defective memory cell among memory cells connected to a particular bit line $BL_y$ out of bit lines BL0, ..., $BL_y$, ..., BLy, a spare bit line $BL_s$ is substituted for the bit line $BL_y$.

Fuses are blown therefore so that connection between node S1 and FETs $Q_{s1}$, $Q_{s3}$, ..., $Q_{s2n+1}$ are the same as that between node N1 and FETs $Q_{N1}$, $Q_{N3}$, ..., $Q_{Nn}$. More specifically, fuses $F_{s1}$, $F_{s3}$, ..., $F_{s2n+1}$ are blown, and fuse FNB is blown.

After fuses are blown, nodes N1 and S1 are at an "H" level at time t2. However, if signal $\phi2$ attains an "H" level at time t3, node S2 attains an "H" level, so that a spare bit line $BL_s$ is selected. Since fuse FNB has been blown, node N2 does not attain an "H" level, so that a bit line $BL_y$ will not be selected.

At this time, a signal S2 at an "H" level is input to one input of EXOR circuit ExO and one input of EXOR circuit ExI in I/O data inverting circuit 9.

Accordingly, in a write operation, input data from external I/O terminal 6 is inverted to be sent to input signal control circuit 8. Input signal control circuit 8 sends the inverted input data output from I/O data inverting circuit 9 to I/O line I/O when an input signal control signal WDE is at an "H" level.

Furthermore, in a read operation, data read from a memory cell and output to I/O line I/O is inverted to be sent to output circuit 7.

As described above, when input data from external I/O terminal 6 is to be written to a memory cell in regular memory cell array 1, the input data is written and read as it is.

In addition, although inverted data of input data is written to a memory cell connected to a spare bit line 2, the inverted data is again inverted upon reading, so that the same data as the input data can be read.

Accordingly, in normal read and write operations, the same data as input data is read regardless of whether a memory cell of an address to be subject to read/write operation belongs to regular memory cell array 1 or spare bit line 2.

However, in a read operation after stored informations in all the memory cells become identical, only data read from an address corresponding to a defective bit is inverted to be output as will be described below.

More specifically, in order to sense an address of a repaired defective bit, data is read after charges stored in capacitors of all the memory cells are discharged after a fixed time period, for example, data is read right after the power supply is turned on.

At this time, data at an "L" level will be output to all the bit lines. Since data at an "L" level from a bit line in regular memory cell array 1 is not inverted in I/O data inverting circuit 9, a signal at an "L" level is output to external I/O terminal 6.

On the other hand, data at an "L" level from spare bit line 2 is inverted, so that a signal at an "H" level is output to external I/O terminal 6.

Figure 5:
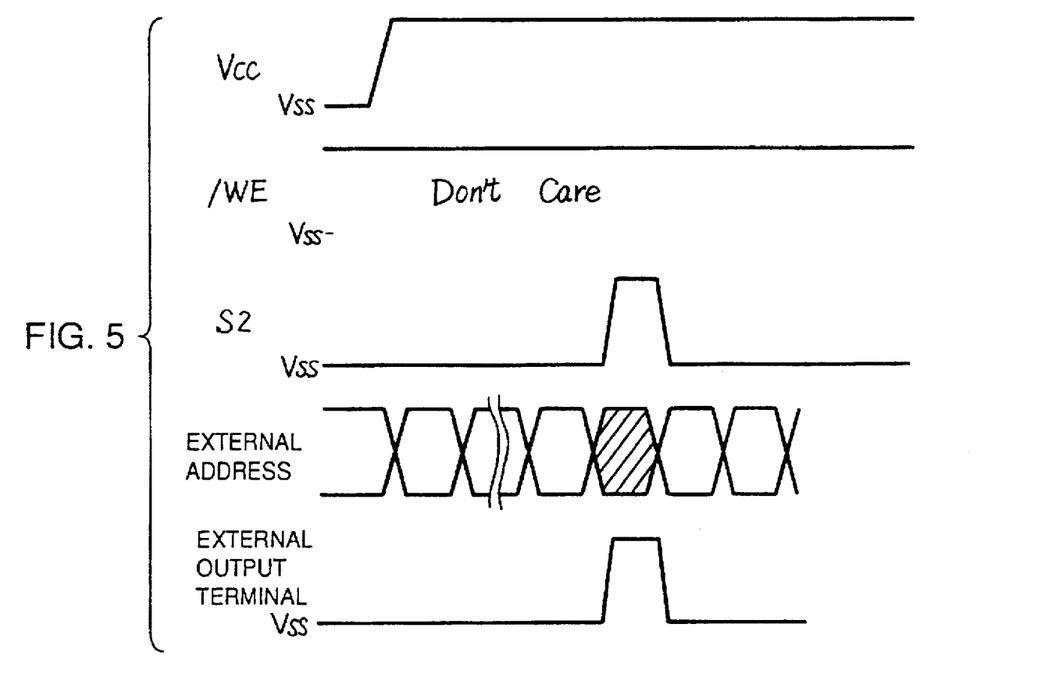
FIG. 5 is a third timing chart illustrating an operation of the first embodiment.

Referring to the timing chart of FIG. 5, a method of sensing a defective bit address will now be described in view of the above description.

After the power supply $V_{CC}$ is turned on at time t1, an external address is successively changed, so that data are read from all the addresses. At this time, it can be sensed by monitoring a potential of external I/O terminal 6 that a memory cell of an address from which a signal at an "H" level is output is a repaired defective memory cell.

At this time, as opposed to the case of the second conventional example, a level of a write control terminal /WE at the time of turning the power supply on may be set arbitrarily.

Figure 6:
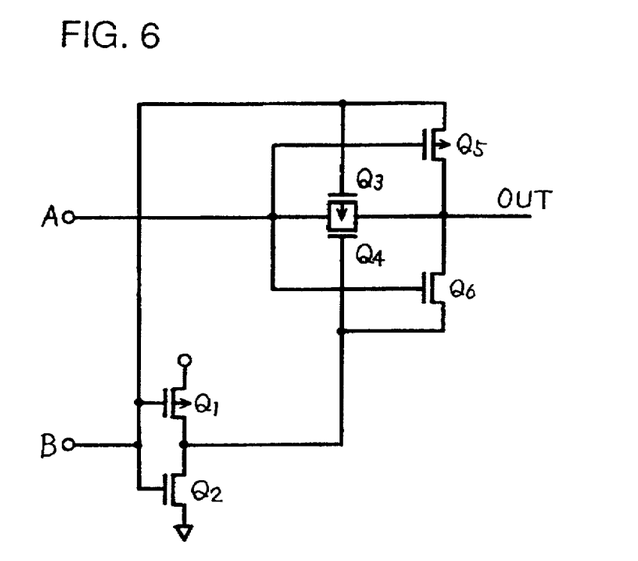
FIG. 6 is a circuit diagram showing an arrangement of an XOR circuit in accordance with the first embodiment.

FIG. 6 is a circuit diagram showing an example in which an XOR circuit included in I/O data inverting circuit 9 is realized with a CMOS.

A P channel MOSFET Q1 and an N channel MOSFET Q2 are connected in series between the power supply $V_{CC}$ for supplying a potential at an "H" level and the ground $V_{SS}$ for supplying a potential at an "L" level, and an input signal B is input in common to the gates thereof. A P channel MOSFET Q3 and an N channel MOSFET Q4 form a transmission gate to which an input signal A is input, and an output of the transmission gate is connected to an output terminal OUT. Input signal B is input to the gate of MOSFET Q3, and the gate of MOSFET Q4 and a connection point between MOSFET Q1 and MOSFET Q2 are connected to each other. Input signal B is input to the source of a P channel MOSFET Q5, and input signal A is input to the gate thereof. The drain of P channel MOSFET Q5 and the drain of an N channel MOSFET Q6 are connected to each other, and this connection point is connected to output terminal OUT. The source of MOSFET Q6 is connected to the gate of MOSFET Q4.

An operation of the circuit shown in FIG. 6 will now be described. If an input terminal B is at an "H" level, both P channel MOS transistor Q3 and N channel MOS transistor Q4 are off, and P channel MOS transistor Q5 and N channel MOS transistor Q6 form an inverter, so that output terminal OUT outputs an inverted value of input terminal A.

On the other hand, if input terminal B is at an "L" level, a transmission gate constituted by P channel MOS transistor Q3 and N channel MOS transistor Q4 is turned on, so that output OUT is at the same level as that of input terminal A.

Accordingly, the above described circuit operates as an exclusive OR gate.

As has been described above, an address of a memory cell replaced with a redundant bit can be externally and electrically checked in a semiconductor memory device of the present embodiment even in the stage of the finished product.

In addition, a potential at a particular external terminal need not be retained at a prescribed value at the time of turning on the power supply.

Although a semiconductor memory device including a spare bit line is shown in the first embodiment, a spare word line may be included instead of a spare bit line.

In addition, fuse elements in the first embodiment may be blown by laser beams or current.

Furthermore, although all the MOSFETs constituting defective bit address registering circuit 4 are N channel enhancement type MOSFETs, the present invention is not limited to this so long as similar operation can be implemented.

[Second Embodiment]

Figure 7:
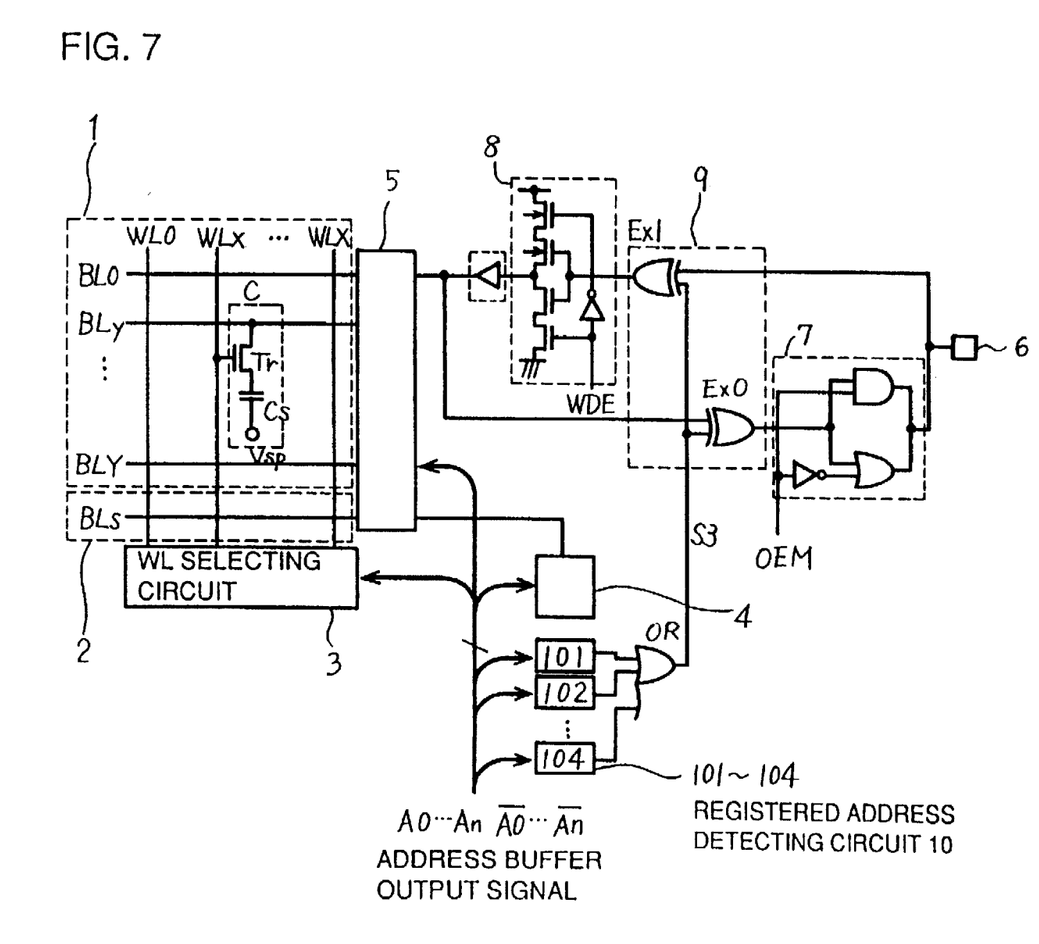
FIG. 7 is a schematic block diagram showing an arrangement of a semiconductor memory device in accordance with a second embodiment of the present invention.

FIG. 7 is a schematic block diagram showing an arrangement of a semiconductor memory device in accordance with a second embodiment of the present invention.

The second embodiment is different from the first embodiment in that a registered address detecting circuit 10 is provided in addition to a defective bit address registering circuit 4.

More specifically, in the first embodiment, an address of a memory cell replaced with a spare bit line is detected by controlling an operation of I/O data inverting circuit 9 by means of an output signal S2 of defective bit address registering circuit 4. In the present embodiment, a particular registered address is stored in registered address detecting circuit 10 by blowing a non-volatile storage element, for example, a fuse element, and an operation of an I/O data inverting circuit 9 is controlled by means of an output signal S3 of registered address detecting circuit 10, so that prescribed information written in a non-volatile manner in each semiconductor memory device can be read from the outside thereof.

The present embodiment is similar to the first embodiment otherwise, and therefore, a like portion is indicated by a like reference and description thereof will not be repeated.

Figure 8:
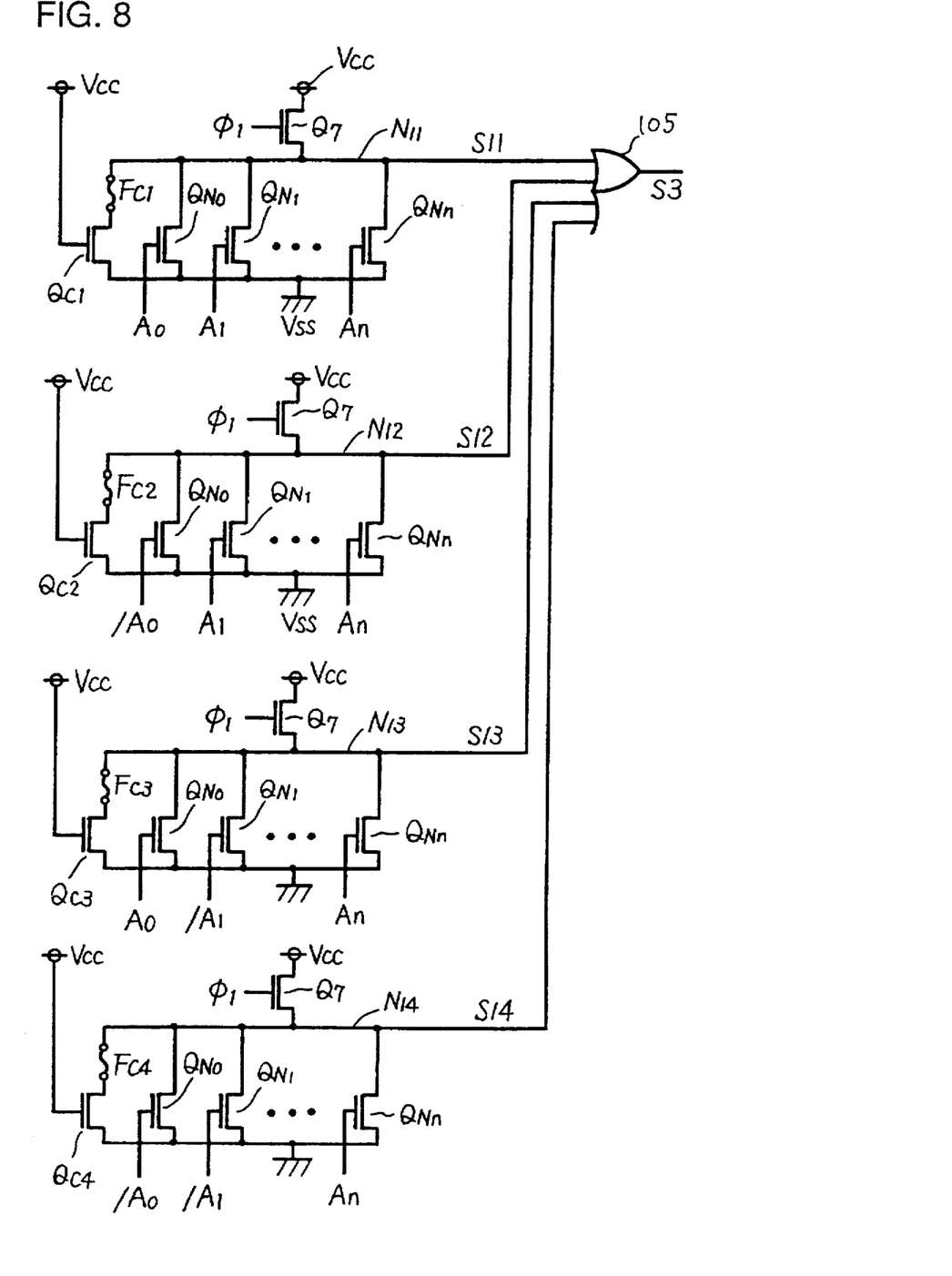
FIG. 8 is a circuit diagram showing an arrangement of a registered address detecting circuit in accordance with the second embodiment of the present invention.

FIG. 8 is a circuit diagram showing in detail an arrangement of registered address detecting circuit 10 in accordance with the second embodiment of the present invention.

In the embodiment shown in FIG. 8, registered address detecting circuit 10 includes registered address decoding circuits 101–104.

Since registered address decoding circuits 101–104 are basically similar to each other in arrangement, only an arrangement of registered address decoding circuit 102 will be described in the following.

N channel enhancement type MOS transistors $Q_{N0}$–$Q_{Nn}$ have their source electrodes connected in common to the ground potential $V_{SS}$, and their drains connected in common to an internal output node N1. An internal address signal /A0 is input to the gate of FET $Q_{N0}$, and internal address signals A1–An are respectively input to the gates of FETs $Q_{N1}$–$Q_{Nn}$.

A control signal $\phi_1$ is input to the gate of an FET Q7, the drain thereof is connected to the power supply potential $V_{CC}$, and the source thereof is connected to internal output node N12. An FET $Q_{C2}$ has its gate connected to the power supply potential $V_{CC}$, its source connected to the ground potential $V_{SS}$, and its drain connected to one end of a fuse element FC2. The other end of fuse element FC2 is connected to internal output node N12.

Accordingly, since FET $Q_{C2}$ is conductive so long as fuse element FC2 is not blown, a potential of internal output node N12 of registered address decoding circuit 102 is held at an "L" level. Therefore, an output signal S12 of registered address decoding circuit 102 is also at an "L" level.

On the other hand, if fuse element FC2 is blown, an output signal S12 of registered address decoding circuit 102 changes as follows. More specifically, in the case of external address signals EXT.A0, . . . , EXT.An="1, 0, . . . , 0", internal address signals /A0, A1, . . . , An="0, 0, . . . , 0" and all the FETs $Q_{N0}$–$Q_{Nn}$ are non-conductive, and therefore, internal output node N12 precharged by a control signal $\phi 1$ is kept at an "H" level. Therefore, an output signal S12 of registered address decoding circuit 102 attains an "H" level.

If external address signals EXT.A0–EXT.An have values other than those described above, any of FETs $Q_{N0}$–$Q_{Nn}$ is rendered conductive, so that internal output node N12 is at an "L" level. Accordingly, an output signal S12 of registered address decoding circuit 102 is at an "L" level.

In the embodiment shown in FIG. 8, internal address signals A0, A1, . . . , An are respectively input to the gates of FETs $Q_{N0}$–$Q_{Nn}$ in registered address decoding circuit 101, internal address signals A0, /A1, . . . , An are respectively input thereto in registered address decoding circuit 103, and internal address signals /A0, /A1, . . . , An are respectively input thereto in registered address decoding circuit 104.

Accordingly, respective output signals S11, S13 and S14 of registered address decoding circuits 101, 103 and 104 attain an "H" level only if external address signals EXT.A0, . . . , EXT.An="0,0,0, . . . , 0", "0,1,0, . . . , 0" or "1,1,0, . . . , 0".

Output signals S11–S14 of registered address decoding circuits 101–104 are input to an OR circuit 105, which in turn outputs a registered address detection signal S3.

If particular 4-bit data such as "LHLL" is to be written to registered address detecting circuit 10, fuse element FC2 of registered address decoding circuit 102 in FIG. 8 is blown.

If data is to be read, data is read after charges stored in capacitors of all the memory cells are discharged after a prescribed time period as in the case of the first embodiment. If data of registered addresses corresponding to registered address decoding circuits 101, 103 and 104 are read, fuse elements FC1, FC3 and FC4 are not blown, and therefore, internal output nodes N11, N13 and N14 fall to an "L" level through FET $Q_{C1}$, FET $Q_{C3}$ and FET $Q_{C4}$, respectively, so that a registered address detection signal S3 also falls to an "L" level. Accordingly, since output data will not be inverted in I/O data inverting circuit 9, data at an "L" level is read to an external I/O terminal.

On the other hand, if data of an address corresponding to registered address decoding circuit 102 is read, fuse element FC2 has been blown, and therefore, internal output node N12 will be caused to be at an "L" level through neither FET $Q_{C2}$ nor FETs $Q_{N0}$–$Q_{Nn}$, so that internal output node N12 is kept at an "H" level and a registered address detection signal S3 attains an "H" level. Accordingly, since output data will be inverted in I/O data inverting circuit 9, data at an "H" level is read to external I/O terminal 6.

If these output data are arranged in the order of external address signals EXT.A0, . . . , EXT. An="0,0,0, . . . , 0"–"1,1,0, . . . , 0", data "LHLL" can be read.

Consequently, with such an arrangement as in the second embodiment, prescribed data such as ranking according to access time can be stored in a non-volatile manner in each semiconductor memory device during manufacturing process, and the data can be checked electrically in the stage of the finished product.

Although an example in which there are four registered address decoding circuits is shown in the second embodiment, there may be any number of registered address decoding circuits depending on the type of data to be prestored.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array having a plurality of memory cells arranged in rows and columns;

memory cell selecting means responsive to an external address signal for performing read/write operation of storage data from and to a corresponding memory cell;

registered address detecting means for storing a prescribed registered address in a non-volatile manner, and activating a registered address detection signal when said external address signal corresponds to said registered address; and input buffer means for receiving external input data and outputting the received data to said memory cell selecting means, said input buffer means including input data inverting means for receiving said input data, and outputting inverted data of the received data if said registered address detection signal is active and outputting the received data without inversion if said registered address detection signal is inactive; and output buffer means for receiving said storage data read by said memory cell selecting means and outputting the received data externally, said output buffer means including output data inverting means for receiving said storage data, and outputting inverted data of the received data if said registered address detection signal is active and outputting the received data without inversion if said registered address detection signal is inactive, wherein said storage data in a memory cell corresponding to said registered address is inverted to be read in a read operation after a prescribed operation in which said storage data in every memory cell are set to a prescribed value.

2. A semiconductor memory device comprising:

a memory cell array having a plurality of memory cells arranged in rows and columns;

memory cell selecting means responsive to an external address signal for performing read/write operation of storage data from and to a corresponding memory cell;

registered address detecting means for storing a prescribed registered address in a non-volatile manner, and activating a registered address detection signal when said external address signal corresponds to said registered address;

input buffer means for receiving external input data and outputting the received data to said memory cell selecting means, said input buffer means including input data inverting means for receiving said input data, and outputting inverted data of the received data if said registered address detection signal is active and outputting the received data without inversion if said registered address detection signal is inactive;

output buffer means for receiving said storage data read by said memory cell selecting means and outputting the received data externally, said output buffer means including
output data inverting means for receiving said storage data, and outputting inverted data of the received data if said registered address detection signal is active and outputting the received data without inversion if said registered address detection signal is inactive; and
address buffer means for receiving said external address signal and outputting complementary internal address signals, wherein
said storage data in a memory cell corresponding to said registered address is inverted to be read in a read operation after a prescribed operation in which said storage data in every memory cell are set to a prescribed value, and
said registered address detecting means includes
at least one decoding means for receiving said internal address signals and outputting said registered address detection signal,
said decoding means including
a dynamic type decoding circuit for receiving said internal address signals according to a corresponding registered address and outputting said registered address detection signal, and
a fuse element for coupling an output node of said dynamic type decoding circuit and a prescribed power supply potential.

3. The semiconductor memory device according to claim 2, wherein
said decoding means includes
a first MOS transistor having its gate receiving a prescribed control signal and having one of its source and its drain connected to a first power supply,
an internal output node connected to another of the source and the drain of said first MOS transistor,
a plurality of MOS transistors connected in parallel between said internal output node and a second power supply, and having their gates respectively receiving corresponding said internal address signals, and
a second MOS transistor and a fuse element connected in series between said internal output node and said second power supply, wherein
said plurality of MOS transistors receives at their gates internal address signals out of said complementary internal address signals, respectively, which render said plurality of MOS transistors non-conductive if said internal address signals correspond to said prescribed registered address, and
a prescribed potential is applied to a gate of said second MOS transistor, so that said second MOS transistor is rendered conductive.

4. The semiconductor memory device according to claim 1, wherein
said input data inverting means includes
an exclusive OR gate for receiving as inputs said input data and said registered address detection signal, and
said output data inverting means includes
an exclusive OR gate for receiving as inputs said stored data and said registered address detection signal.

5. The semiconductor memory device according to claim 1, wherein
said semiconductor memory device is a dynamic type semiconductor memory device, and said prescribed operation is an operation of turning on a power supply.

6. The semiconductor memory device according to claim 1, wherein
said memory cell array has a plurality of addresses for storing particular information,
a selected address out of said addresses for storing particular information is stored as said registered address, and
particular information is represented by an arrangement of data sequentially read from memory cells corresponding to said addresses for storing particular information.

7. A semiconductor memory device having a redundant bit for replacing a defective memory cell, comprising:
a memory cell array having a plurality of memory cells including a redundant memory cell corresponding to said redundant bit and arranged in rows and columns;
memory cell selecting means responsive to an external address signal for performing read/write operation of storage data from and to a corresponding memory cell,
said memory cell selecting means including
non-volatile storage means for deactivating an operation for said external address signal corresponding to said defective memory cell;
defective bit address registering means for storing a defective bit address corresponding to said defective memory cell in a non-volatile manner, and activating a redundant memory cell selection signal if said external address signal corresponds to said defective bit address;
redundant memory cell selecting means responsive to said redundant memory cell selection signal for performing read/write operation of storage data from and to corresponding said redundant memory cell;
input buffer means for receiving external input data and outputting the received data to said memory cell selecting means and said redundant memory cell selecting means,
said input buffer means including
input data inverting means for receiving said input data, and outputting inverted data of the received data if said redundant memory cell selection signal is active and outputting the received data without inversion if said redundant memory cell selection signal is inactive; and
output buffer means for receiving said storage data read by said memory cell selecting means and said redundant memory cell selecting means and outputting the received data externally,
said output buffer means including
output data inverting means for receiving said stored data, and outputting inverted data of the received data if said redundant memory cell selection signal is active and outputting the received data without inversion if said redundant memory cell selection signal is inactive, wherein
said storage data in a memory cell corresponding to said defective bit address is inverted to be read in a read operation after a prescribed operation in which said storage data in every memory cell are set to a fixed value.

8. The semiconductor memory device according to claim 7, further comprising:
address buffer means for receiving said external address signal and outputting complementary internal address signals, wherein
said defective bit address registering means includes at least one decoding means for receiving said internal address signals and outputting said redundant memory cell selection signal, said decoding means including a first MOS transistor having its gate receiving a prescribed control signal and having one of its source and its drain connected to a first power supply, an internal output node connected to another of the source and the drain of said first MOS transistor, a plurality of MOS transistors each having its gate receiving corresponding said internal address signal and each having one of its source and its drain connected to a second power supply, and a plurality of fuse elements each connecting another of the source and the drain of each of said plurality of MOS transistors and said internal output node to each other, and said decoding means outputting said redundant memory cell selection signal according to a potential of said internal output node.

9. The semiconductor memory device according to claim 7, wherein said input data inverting means includes an exclusive OR gate for receiving as inputs said input data and said redundant memory cell selection signal, and said output data inverting means includes an exclusive OR gate for receiving as inputs said stored data and said redundant memory cell selection signal.

10. The semiconductor memory device according to claim 7, wherein said semiconductor memory device is a dynamic type semiconductor memory device, and said prescribed operation is an operation of turning on a power supply.

* * * * *